United States Patent [19]

Mannik et al.

[11] Patent Number: 5,561,679

[45] Date of Patent: Oct. 1, 1996

[54] RADIOLUMINESCENT SEMICONDUCTOR LIGHT SOURCE

[75] Inventors: Lennart Mannik, Etobicoke; Harry E. Ruda, North York, both of Canada

[73] Assignee: Ontario Hydro, Toronto, Canada

[21] Appl. No.: 419,472

[22] Filed: Apr. 10, 1995

[51] Int. Cl.⁶ .............................. H01S 3/19; H01J 65/00
[52] U.S. Cl. .................... 372/43; 250/462.1; 250/486.1; 257/79; 372/44; 372/70; 372/73
[58] Field of Search .................... 372/43, 69, 70, 372/73, 80, 44; 250/462.1, 486.1, 488.1, 493.1; 257/79

[56] References Cited

U.S. PATENT DOCUMENTS 4,997,597  3/1991  Clough et al. .................... 252/646
5,118,951  6/1992  Kherani et al. .................... 250/462.1

Primary Examiner—James W. Davie
Attorney, Agent, or Firm—Bereskin & Parr; Timothy J. Sinnott

[57] ABSTRACT

A radioluminescent light source comprising a crystalline III–V or II–VI semiconductor or a group IV quantum semiconductor and a radioactive element adapted to cause the semiconductor to produce light is disclosed. The radioactive element, such as tritium, is either incorporated within the semiconductor, preferably proximate to the p-n junction of the semiconductor, or placed adjacent the semiconductor.

14 Claims, 3 Drawing Sheets

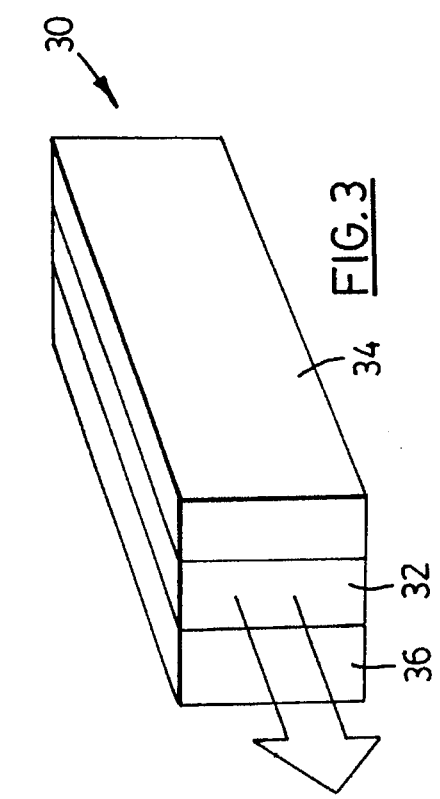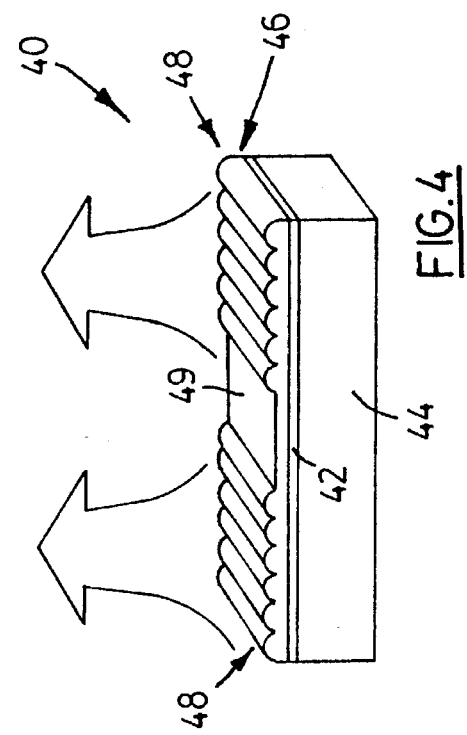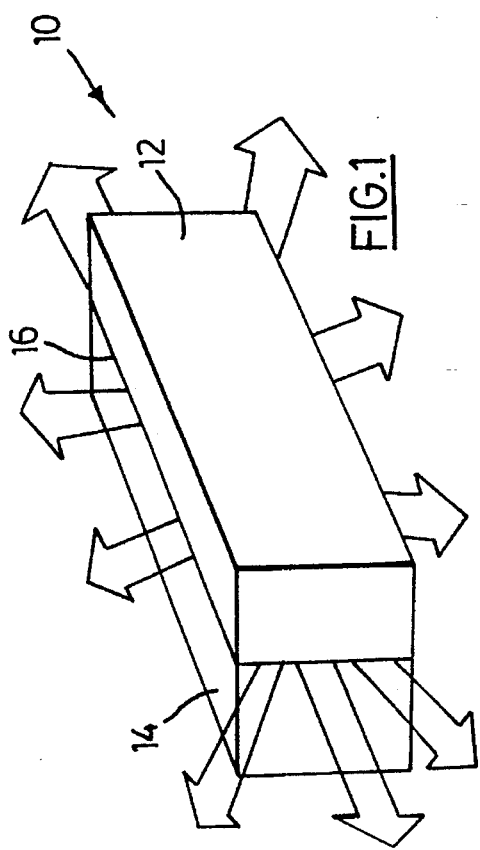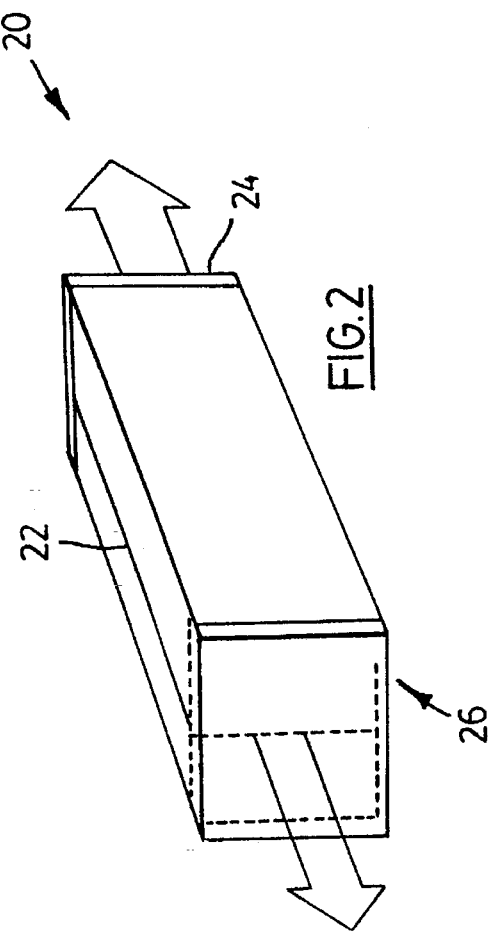

RADIOLUMINESCENT SEMICONDUCTOR LIGHT SOURCE

FIELD OF THE INVENTION

The present invention relates to radioluminescent light sources, particularly radioluminescent light sources comprising a crystalline semiconductor powered by a radioactive element or isotope.

BACKGROUND OF THE INVENTION

Radioluminescence may be defined as the generation of light through the excitation of a phosphor by radiation, such as beta or gamma radiation, resulting from the decay of a radioactive element. In radioluminescence, the excitation of the phosphor occurs by the bombardment of the phosphor with subatomic particles or rays from the radioactive element. One of the first applications of radioluminescence was in luminescent paints for use on watches, clocks, aircraft instrument panels and similar devices. A common formulation for these radioluminescent paints was a mixture of radium and a zinc sulphide phosphor. While these paints were quite luminescent, their use was stopped once the toxicity of radium was recognized. This led to the development of radioluminescent paints containing less harmful radioisotopes, such as tritium. Generally, tritium was incorporated into these paints by substitution for hydrogen in the organic resins of the paint, which was used as a binder for the zinc sulphide phosphor. Because of the opacity of the resin, and the tendency of tritium to desorb out of the resin binder, these paints were, at best, inefficient light sources.

A further type of radioluminescent light source, developed in the 1960's, was tritium gas filled glass tubes. In these lights, the interior surface of the tube was coated with a phosphor, such as zinc sulphide, and the tube was filled with tritium gas. While these lights are much more efficient than radioluminescent paints, commercial acceptance of these lights has been hampered, due to the public perception of dangers resulting from possible breakage of the lights.

A solid state radioluminescent light source is shown in U.S. Pat. No. 5,118,951 to Kherani et al. This patent discloses a light source comprising a radioactive element entrapped in an amorphous semiconductor. While this device has some advantages over conventional radioluminescent paints and phosphor coated tritium gas filled glass tubes, it does have several limitations, as detailed below.

In a semiconductor material, excitation of the material by an external source creates an excess of electron-hole pairs above the number of electron-hole pairs present at thermal equilibrium. The excess carriers then recombine to discharge their energy and return the semiconductor to equilibrium. The main mechanisms for this recombination are radiative recombination, in which the recombination process results in light emission, and non-radiative recombination, in which the recombination results in heat emission. The efficiency of a luminescent semiconductor is a measure of the fraction of the total number of excess carriers which radiatively recombine to produce light.

The rate of radiative recombination is dependent on the carrier lifetime, which determines the number of excess carriers that can form electron-hole pairs, and the pair recombination coefficient, which expresses how likely it is for a given pair to recombine radiatively. Amorphous semiconductors typically are characterized by short carrier lifetimes and low recombination coefficients, and therefore have limited useful light output. Accordingly, devices incorporating amorphous semiconductors have limited commercial applications.

Further, as the non-radiative, or heat producing, recombination mechanism of amorphous semiconductors is very efficient, the radiative efficiency is further lowered. In amorphous semiconductors, there are typically densities of non-radiative recombination centers that are at least as high as the densities of the radiative recombination centers, and often higher. This effect also contributes to limiting any spectral output of amorphous semiconductor light sources to infrared.

A further limitation of using amorphous materials for light emitting applications is their notorious instability under even weak excitation due to the Staebler-Wronski effect. The underlying mechanism for this is defect formation due to the easy breaking of weak bonds, resulting in rapid material damage which prevents obtaining useful light emission under radioisotope excitation.

SUMMARY OF THE INVENTION

It is therefore an object of the present invention to provide a radioluminescent light source with improved efficiency, and in which a variety of wavelengths of light may be produced. It is a further object of the present invention to provide a radioluminescent light source that has sufficient radiation hardness to at least meet the useable life of the radioisotope used.

These and other objects of the present invention are accomplished by providing a radioluminescent light source comprising a crystalline semiconductor selected from the group of III–V materials, II–VI materials, group IV quantum materials and mixtures thereof, and a radioactive element adapted to cause said semiconductor to produce light.

With light sources according to the present invention, it is possible to achieve useable light output with low energy radioisotopes.

BRIEF DESCRIPTION OF THE DRAWINGS

FIG. 1 is a perspective view of a light source according to one embodiment of the present invention.

FIG. 2 is a perspective view of a second embodiment of the present invention, in which coherent light is produced.

FIG. 3 is a perspective view of a double heterostructure light source according to the present invention.

FIG. 4 is a side perspective view of a further embodiment of the present invention, having an integral grating.

DETAILED DESCRIPTION OF THE PREFERRED EMBODIMENTS

Figure 5A:
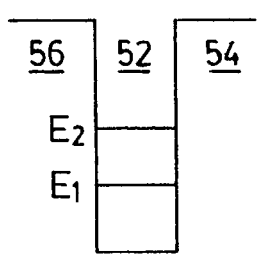
FIG. 5A is a band edge profile of a single quantum well structure in accordance with the present invention.
Figure 5B:
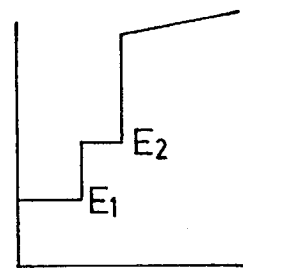
FIG. 5B is a density of states diagram for the embodiment of FIG. 5A.

In accordance with the present invention, a radioluminescent light source comprises a crystalline semiconductor and a radioactive element adapted to cause the semiconductor to produce light. The semiconductors useful in the present invention are those materials in which the atoms are chosen from groups III and V of the periodic table of the elements (designated as a III–V material herein), those materials in which the atoms are selected from groups II and VI of the periodic table of the elements (designated as a II–VI material herein), those materials having a quantum structure in which the atoms are selected from group IV of the periodic table of the elements (designated a group IV quantum material herein), and mixtures thereof. The material may be, for example, crystalline gallium arsenide (c-GaAs), a crystalline silicon germanium (c-SiGe) quantum well or alloys such as crystalline gallium indium arsenide phosphide (c-GaInAsP) and crystalline zinc selenium gallium arsenide (c-ZnSeGaAs).

In accordance with the present invention, the electron-hole pairs of the semiconductor are produced by the impingement of a decay particle from a radioisotope, such as tritium, promethium-147, americium-241, carbon-14, krypton-85 and mixtures thereof. In order to produce light, the semiconductor may be exposed to a source containing the radioisotope, such as, for the case of tritium, tritium gas, tritiated water or tritium bound within an organic or inorganic matrix. Alternatively, the tritium or other radioisotope may be incorporated into the semiconductor, as described below.

The preferred structure of the semiconductor of the present invention is a p-n homo- or heterojunction or a structure having quantum well states. These structures are useful in making light emitting diodes (LEDs), superluminescent diodes and lasers. Such devices may take the form of a single source, an array, a remotely addressable device, multicolor lights, including infrared wavelengths such as first and second atmospheric windows, and millimeter and microwave emitters.

Techniques suitable for preparing the light sources of the present invention include conventional molecular beam epitaxy, metalorganic chemical vapor deposition and liquid phase epitaxy. Preferably, molecular beam epitaxy or metalorganic chemical vapor deposition is used, as these techniques are capable of producing very thin layers, as thin as 5 nm, which are useful for quantum well structures.

FIG. 1 shows a light source 10 comprising a crystalline p-type semiconductor 12 and an n-type semiconductor 14 adjacent one another. Preferably, semiconductors 12, 14 are direct band gap materials, such as GaP. In light source 10, the p-n junction 16 functions as an incoherent light emitter or light emitting diode (LED). The light source 10 is powered by tritium or another suitable isotope, which is either impregnated in a separate device, such as a metal tritide placed adjacent the external surfaces of the semiconductor, or directly into the semiconductor matrix. The latter could be accomplished by gas phase (thermal diffusion, plasma or ion beam) or electrochemical techniques. Unlike conventional LEDs, in which current flow is through the layer structure to the active junction where radiative recombination and light emission occurs, the radioisotopes may be placed on either side of the active junction within a minority carrier diffusion length of the junction, typically about $10^{-1}$ to $10^2$ micrometers.

Because of the increased efficiency of light sources of the present invention, lower radioisotope concentrations may be used to produce a given light output. At high levels of excitation sufficient to cause population inversion, stimulated emission will dominate over spontaneous emission and super-radiance will occur, resulting in a superluminescent LED. These devices have several important advantages over conventional LEDs, such as higher brightness and narrower spectral output. Such devices are well suited for applications such as short haul optical fiber communications and optical gyroscopes.

FIG. 2 shows a further embodiment of the present invention, in which a semiconductor matrix 20 having a p-n junction 22 has mirrored end faces 24 and 26. This mirroring is achieved by cleaving the end faces 24, 26 along atomic planes, resulting in end faces which are flat to within atomic dimensions. The mirrors result in the formation of an optical cavity which is able to provide gain and thereby form a laser under superluminescent excitation conditions. Such devices have even higher light outputs and a lower divergence (i.e. higher brightness), as well as even narrower spectral output compared to superluminescent LEDs. This makes these devices more suitable for applications involving long haul optical fiber communications, and other higher power applications (e.g., CD-ROMs and laser printers).

FIG. 3 shows a further embodiment of the present invention, in which a light source 30 comprises an active layer 32 of a narrow band gap semiconductor, such as GaAs, disposed between two layers 34, 36 of a wider band gap semiconductor, such as GaAlAs, where all layers are lattice matched. With such a double heterostructure semiconductor, the heterojunction cladding layers 34, 36 are chosen to perform two functions, namely to contain the excess carriers in a spatially limited column to enhance the recombination probability, by use of the energy barriers at the interfaces between the layers, and secondly to wave guide the emitted light by confining it in the active layer, due to the difference in the refractive index between the active layer 32 and the cladding layers 34, 36.

In the embodiment shown in FIG. 3, the radioisotope may be diffused within the structure 30, resulting in carrier production and subsequent diffusion into the active layer 32. These carriers would then recombine in the active layer, leading to emission of coherent light. Further, the radioisotope may be selectively diffused within the structure 30, for example by using appropriate dopants to confine the radioisotope. With such structures, the radioisotope impregnated region may be the active layer alone or could be immediately adjacent the active layer. If the radioisotopes are located solely within the junction region, there would only be minor perturbation of the steady state carrier concentration in the active layer 32, and hence little change in the refractive index of the material. This would result in a large increase in the gain and internal quantum efficiency.

Also, the interfaces between the layers could be coated to optimize the reflectivity of the active layer 32. For example, the interfaces could be coated with suitable single or multilayer dielectric coatings, such as silicon dioxide, silicon nitride or silicon oxynitride, to a thickness of from about 50 nm to about 500 nm.

A further embodiment of the present invention is shown in FIG. 4, in which a light source 40 comprises an active layer 42 disposed between a first cladding layer 44 and a second cladding layer 46. While the first layer 44 is generally rectangular in cross-section, the second layer 46 comprises a plurality of gratings 48, consisting of a periodic pattern of grooves spaced to ensure constructive interference of the emitted light, separated by generally flat regions 49. The gratings 48 can be formed by etching, and in an alternative embodiment can be etched into the active layer 42. Such a structure can be used produce a single frequency coherent light emitter. With such a structure, distributed feedback can be readily induced, and wavelength dispersion is minimized.

FIGS. 5–8 show representative band edge profiles and density of states diagrams for various embodiments of the present invention in which quantum well structures are utilized, the "A" figure showing the band edge profile and the "B" figure the density of states. For clarity, only the ground and selected excited states are shown in these figures. In the single quantum well structure shown in FIG. 5A, a thin layer 52 of a narrow bandgap semiconductor material, such as GaAs, is sandwiched between two layers 54, 56 of a wider band gap material, such as GaAlAs. The layer 54, 56 trap and quantum mechanically confine the mobile carriers generated within layer 52. In a single quantum well structure, the continuum of energy states available breaks down into a staircase of levels, as shown in FIG. 5A, providing a much larger number of states at lower energies. With such a structure, the required population inversion condition to produce a laser is achieved with much lower radioisotope concentration. Wavelength tuning in these structures can be achieved by adjusting the composition and thickness of the active layer.

Figure 6A:
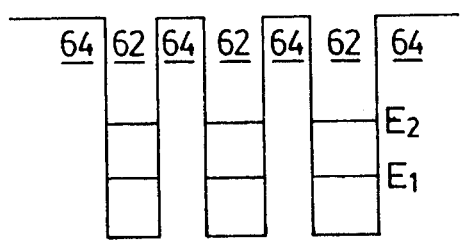
FIG. 6A is a band edge profile of a multiple quantum well structure in accordance with the present invention.
Figure 6B:
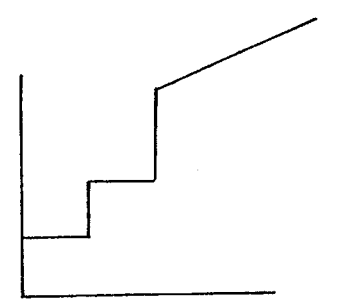
FIG. 6B is a density of states diagram for the embodiment of FIG. 6A.

FIGS. 6A and 6B depict multiple quantum well structures, in which layers 62 of low band gap material are alternated with layers 64 of higher band gap material. With such structures, the volume of excited material is increased and higher output powers are produced.

Figure 7A:
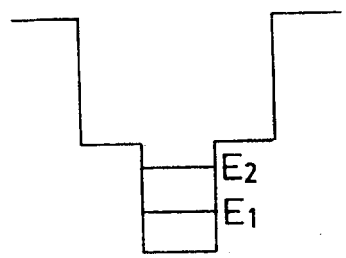
FIG. 7A is a band edge profile of a SCH quantum well structure in accordance with the present invention.
Figure 7B:
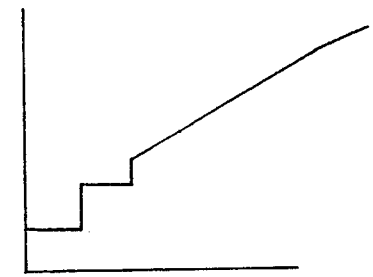
FIG. 7B is a density of states diagram for the embodiment of FIG. 7A.
Figure 8A:
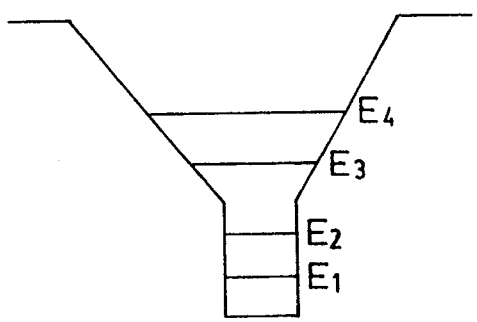
FIG. 8A is a band edge profile of a GRINSCH quantum well structure in accordance with the present invention.
Figure 8B:
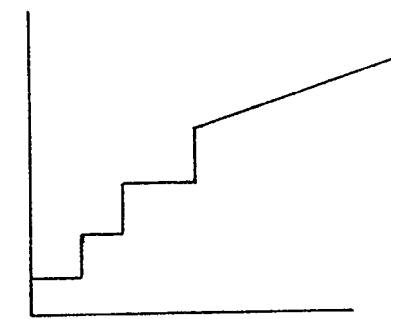
FIG. 8B is a density of states diagram for the embodiment of FIG. 8A.

FIGS. 7 and 8 show quantum well structures in which the carrier and optical cavities are spatially separated. The simplest structure that offers separate confinement is a separate confinement heterostructure (SCH) as shown in FIG. 7A. Although this offers lower lasing thresholds and is relatively easy to fabricate, the optical confinement is less than ideal. This may be improved by resorting to a graded refractive index (GRIN) and SCH structure given the acronym GRINSCH, such as shown in FIG. 8A. This is achieved by linearly grading the alloy composition, resulting in a parabolic refractive index variation. In conventional laser structures, the required optical cavity dimensions are often much larger than those for carrier confinement and a compromise is made usually favoring carrier confinement, since this dictates the lasing threshold. However, this compromise leads to poor confinement of emitted radiation and low efficiency lasers. In GRINSCH structures, the tighter confinement results in higher output powers and lower beam divergences (i.e., higher brightness).

Figure 9A:
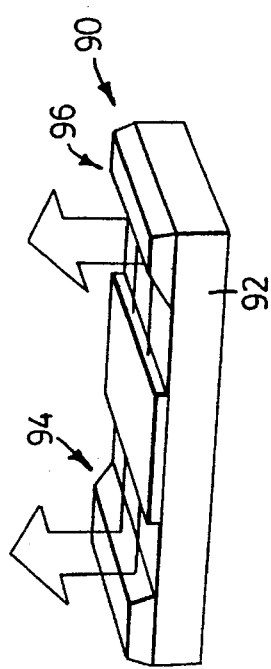
FIG. 9A is a side view of a further embodiment of the present invention, which is capable of redirecting the emitted light in predetermined directions.
Figure 9B:
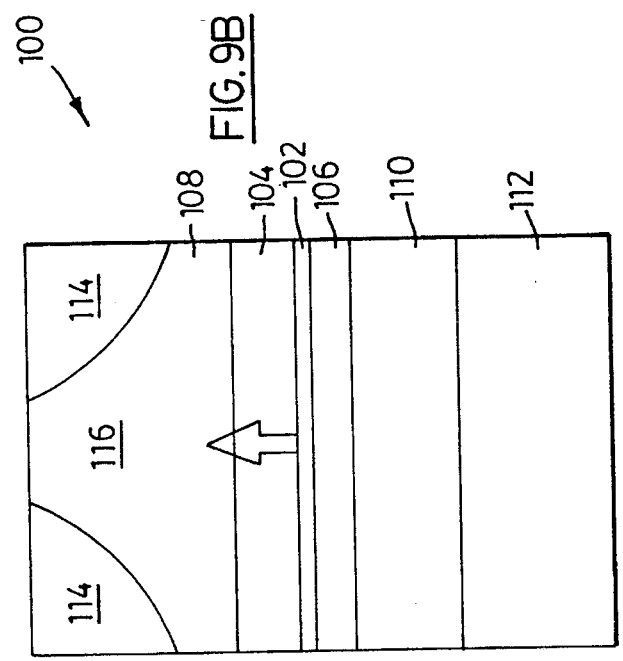
FIG. 9B is a cross-sectional view of a further embodiment of the present invention in which the light emitted is perpendicular to the plane of the semiconductor.

FIGS. 9A and 9B show further embodiments of the present invention, in which light emission is directed out of the plane of the semiconductor. FIG. 9A shows a light source 90 comprising a semiconductor substrate 92 and two external mirrors 94 and 96, which are used to direct the light perpendicular to the plane of the substrate 92. Mirrors 94, 96 may be fabricated using known techniques, such as lithography.

FIG. 9B shows a vertical cavity surface emitting laser (VCSEL), in which the laser structure is fabricated with a vertical cavity design, eliminating the need for external mirrors. In this embodiment, a semiconductor 100 has a central active layer 102 which is disposed between two confinement layers 104 and 106. An n-type multilayer mirror stack 110 serves as a highly reflecting mirror for the optical cavity directing light vertically, while an output p-type mirror stack 108 is partially reflecting and provides the upper mirror for the optical cavity. Immediately adjacent to the n-type mirror 110 is an n-type substrate 112. An annular blocking layer 114 provides a barrier and directs carriers through a central channel 116 in the device. The absence of any contacts in these structures, especially in channel 116, enhances the light output in a radioisotope excited laser compared with a conventional semiconductor laser.

With lasers according to the present invention, such as those described above, it is possible to modulate the laser using, for example, controlled frequency microwave radiation. It is also possible to tune the laser to emit light of a specific colour, again using free carrier heating by microwave radiation.

Figure 10A:
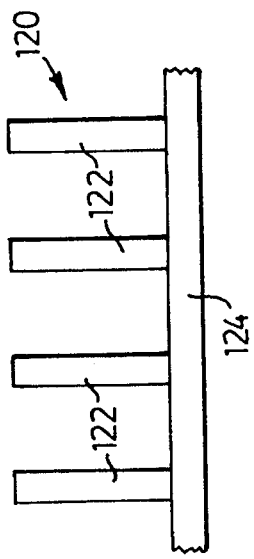
FIG. 10A is a cross-sectional view of a further embodiment of the present invention, in which the radioactive element is impregnated in a porous semiconductor.
Figure 10B:
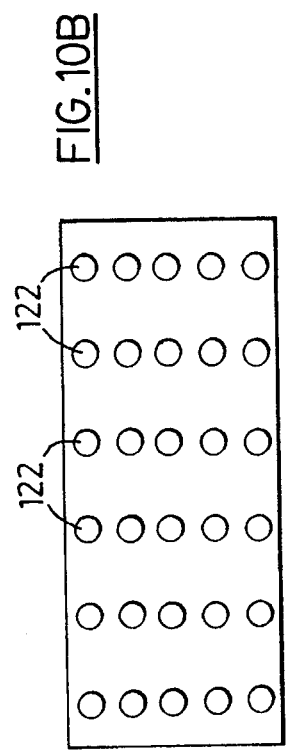
FIG. 10B is a top plan view of the embodiment of FIG. 10A.

FIGS. 10A and 10B show a further embodiment of the present invention, in which a light source 120 comprises a nanopatterned crystalline semiconductor, such as porous Si or SiGe, having a plurality of filaments 122 extending from a continuous substrate 124. The radioisotope can be impregnated in the semiconductor, and distributed throughout the filaments and the substrate. The filaments 124 have a very high aspect ratio, resulting in quantum confinement of the carriers and the capability to produce light. Such structures can also be fabricated from crystalline semiconductor membranes.

With an uncoated crystalline gallium phosphide homojunction structure (GaP:Zn,O) in the presence of 1 atm of tritium gas, light having a brightness of several microlamberts has been observed, which is readily visible to the naked eye. Under the same conditions, an amorphous semiconductor would be predicted to have a brightness of $10^{-6}$ microlamberts, which is undetectable to the unaided eye. Accordingly, an amorphous semiconductor light source would not be useful to fabricate devices such as LEDs or lasers.

While the embodiments of the present invention described above are useful as light sources on their own, they may also be integrated monolithically with other components on the same chip. Examples of such integrated devices include coupling sources operating at different frequencies into mixers (e.g. parametric oscillators) to yield millimeter/microwave radiation, or multiplexing a series of such sources using integral Mach-Zehnder interferometers or Rowland circle gratings to yield a white light adder.

All of the light emitting structures discussed in these embodiments can be expected to have useful lifetimes exceeding the half life of the radioisotope utilized. This may have benefits for applications involving inaccessible or hostile environments.

We claim:

1. A radioluminescent light source comprising a crystalline semiconductor selected from the group of III–V materials, II–VI materials, group IV quantum materials and mixtures thereof, and a radioactive power source comprising at least one radioactive element, said radioactive power source positioned relative to said semiconductor to allow for impingement of particles emitted by said at least one radioactive element on said semiconductor.

2. A radioluminescent light source as claimed in claim 1, wherein said radioactive element is commingled with said semiconductor.

3. A radioluminescent light source as claimed in claim 1, wherein said radioactive element is diffused within said semiconductor.

4. A radioluminescent light source as claimed in claim 1, wherein said radioactive element is adjacent said semiconductor.

5. A radioluminescent light source as claimed in claim 1, wherein said semiconductor comprises an active layer disposed between two cladding layers.

6. A radioluminescent light source as claimed in claim 5, wherein the compositions of said active layer and said cladding layers differ.

7. A radioluminescent light source as claimed in claim 6, wherein said radioactive element is proximate the interfaces between said active layer and said cladding layers.

8. A radioluminescent light source as claimed in claim 6, wherein said radioactive element is diffused within said semiconductor.

9. A radioluminescent light source as claimed in claim 8, wherein said radioactive element is diffused within said active layer.

10. A radioluminescent light source as claimed in claim 9, wherein said radioactive element is selectively diffused within said active layer to control the active source generation area.

11. A radioluminescent light source as claimed in claim 10, wherein said semiconductor further comprises at least one hydrogen blocking layer to control the active source generation area.

12. A radioluminescent light source as claimed in claims 1, 2, 3 or 4, wherein said light source is adapted to be capable of producing coherent light.

13. A radioluminescent light source as claimed in claim 12, wherein the emitted light is modulated.

14. A radioluminescent light source as claimed in claim 13, wherein the emitted light is modulated using microwave radiation.

* * * * *